(12) United States Patent
Usami

(10) Patent No.: US 9,457,480 B2
(45) Date of Patent: *Oct. 4, 2016

(54) TRANSPORT DEVICE

(71) Applicant: DAIFUKU CO., LTD., Osaka-shi, Osaka (JP)

(72) Inventor: Makoto Usami, Shiga (JP)

(73) Assignee: DAIFUKU CO., LTD., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/715,906

(22) Filed: May 19, 2015

(65) Prior Publication Data

US 2015/0336280 A1    Nov. 26, 2015

(30) Foreign Application Priority Data

May 22, 2014    (JP) .................. 2014-105738

(51) Int. Cl.
*B66C 1/42*    (2006.01)
*B25J 15/10*   (2006.01)
*B25J 15/00*   (2006.01)
*B25J 19/02*   (2006.01)
*H01L 21/67*   (2006.01)
*H01L 21/677*  (2006.01)
*H01L 21/687*  (2006.01)

(52) U.S. Cl.
CPC ............ *B25J 15/10* (2013.01); *B25J 15/0028* (2013.01); *B25J 19/02* (2013.01); *H01L 21/6773* (2013.01); *H01L 21/67259* (2013.01); *H01L 21/67733* (2013.01); *H01L 21/68707* (2013.01)

(58) Field of Classification Search
CPC .... B25J 15/00; B25J 15/0009; B25J 15/026; B25J 15/0253; B25J 15/10; B25J 15/0028; B25J 19/02; A01D 87/003; B25B 9/00; B66C 1/24; B66F 9/181; B66F 9/183; B66F 9/18; B66F 9/188; B66F 9/195; B65G 57/00; B65G 57/18; B65G 61/00; B65H 31/30; B65B 5/068; H01L 21/67259; H01L 21/6773; H01L 21/67733; H01L 21/68707
USPC ....................................... 294/119.1
See application file for complete search history.

(56) References Cited

U.S. PATENT DOCUMENTS

| | | | | |
|---|---|---|---|---|
| 4,852,928 A | * | 8/1989 | Monforte ............... | B25J 13/082 |
| | | | | 294/119.1 |
| 5,017,075 A | * | 5/1991 | Block .................... | B65G 37/00 |
| | | | | 19/65 A |

(Continued)

FOREIGN PATENT DOCUMENTS

JP    2004-025427 A    1/2004    ............. B25J 15/08

*Primary Examiner* — Stephen Vu
(74) *Attorney, Agent, or Firm* — Kusner & Jaffe

(57) ABSTRACT

A transport device that allows transport containers varying in shape or size to be transported without changing a device configuration, and can prevent works in a transport container from popping out of the transport container with a simple device configuration. An overhead carriage includes a chucking device that holds a magazine accommodating works. The overhead carriage transports the magazine held by the chucking device. The chucking device includes a holding unit that holds the magazine and a sensor that detects the magazine held by the holding unit. The holding unit is controlled based on the detection of the sensor to hold the magazine so that the holding unit prevents works stored in the magazine from popping out.

5 Claims, 5 Drawing Sheets

(56) References Cited

U.S. PATENT DOCUMENTS

| | | | |
|---|---|---|---|
| 5,150,937 A * | 9/1992 | Yakou | B25J 9/1612 294/119.1 |
| 6,592,324 B2 * | 7/2003 | Downs | B25J 15/0253 294/104 |
| 7,887,108 B1 * | 2/2011 | Cawley | B25J 15/022 294/106 |
| 7,938,614 B2 * | 5/2011 | Fritzsche | B65G 57/06 414/622 |
| 8,267,451 B2 * | 9/2012 | Pedrazzini | B25J 13/088 294/119.1 |

* cited by examiner

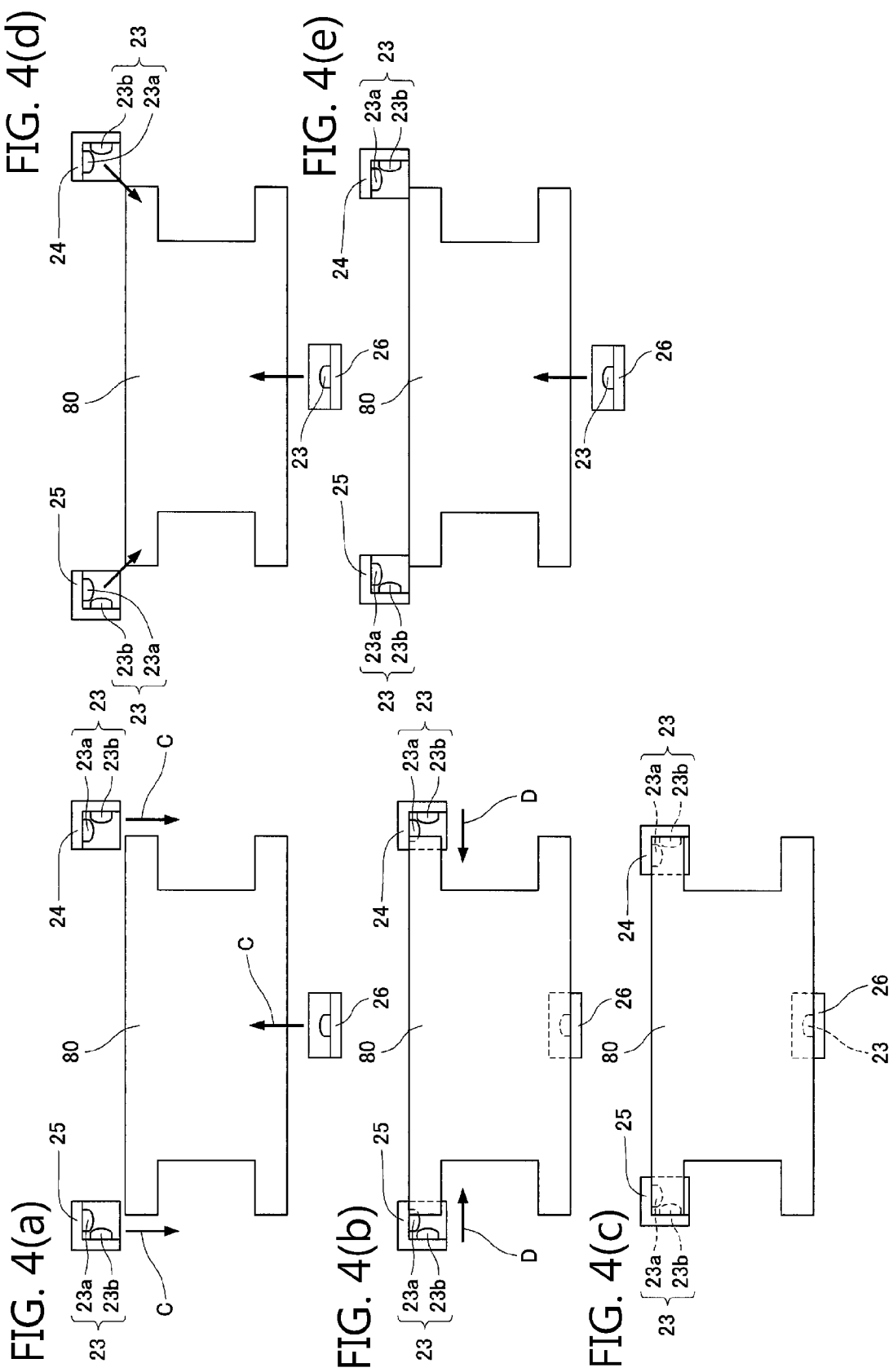

TRANSPORT DEVICE

RELATED APPLICATIONS

This application claims priority from Japanese Patent Application No. 2014-105738, filed with the Japanese Patent Office on May 22, 2014, the entire content of which is hereby incorporated by reference.

FIELD OF THE INVENTION

The present invention relates to a transport device that transports a transport container storing works such as a semiconductor substrate.

BACKGROUND OF THE INVENTION

Conventionally, in production facilities for semiconductor devices and so on, transport containers that contain works such as a semiconductor substrate are sequentially transported between multiple processing units while being held by overhead carriages (transport devices) that travel along a traveling rail provided near the ceiling of a facility.

For example, Japanese Patent Laid-Open No. 2004-25427 discloses a transport device that transports works to processing units while traveling between the processing units in a clean room. The transport device includes an elevating unit that is provided on a horizontal movement unit and vertically moves a work holding unit for holding a work (enclosed container), transferring the works between the work holding unit and the processing units.

In the transport device of Japanese Patent Laid-Open No. 2004-25427, the work holding unit includes a work holding part extended in a channel shape to two sides of a work (enclosed container). The work holding unit holds the work (enclosed container) with opposed hands provided on the lower ends of two sides of the work holding part so as to hold the bottom of the work.

However, the transport device of Japanese Patent Laid-Open No. 2004-25427 is configured to transport enclosed containers (transport containers) of the same shape and thus cannot always transport containers having varying shapes or sizes. Thus, particularly in the downstream process of a semiconductor device manufacturing process, transport containers of varying shapes or sizes need to be transported and thus a device configuration (e.g., the configuration of a container holding unit) disadvantageously needs to be changed depending on the shapes or sizes of transport containers.

Moreover, only a few transport containers used in the downstream process of the semiconductor device manufacturing process include popping preventing members (e.g., lids for closing the transport containers) for preventing stored works from popping out of the transport containers. Thus, such a popping preventing member needs to be additionally provided on the transport device, disadvantageously leading to a complicated device configuration.

An object of the present invention is to provide a transport device that can transport containers of varying shapes or sizes without changing the device configuration and prevent a work from popping out of a transport container with a simple device configuration.

SUMMARY OF THE INVENTION

The problems to be solved by the present invention are solved by the following solutions:

A transport device according to a first aspect of the present invention is a transport device including a container holding device that holds a transport container for storing a work, the transport device transporting the transport container held by the container holding device, the container holding device including: a holding unit that holds the transport container; and a container detecting unit that detects the transport container held by the holding unit, wherein the holding unit is controlled based on the detection of the container detecting unit to hold the transport container so that the holding unit prevents the work stored in the transport container from popping out of the transport container.

With this configuration, the container detecting unit detects the transport container. This controls a holding operation of the holding unit on the transport container and allows the holding unit to prevent the work stored in the transport container from popping out of the transport container.

According to an invention described in a second aspect, in the transport device according to the first aspect, the holding unit holds the transport container so as to cover a storage port for the work in the transport container, preventing the work stored in the transport container from popping out of the transport container.

With this configuration, the holding unit holding the transport container covers the storage port for the work, thereby preventing the work stored in the transport container from popping out of the transport container.

According to an invention described in a third aspect, in the transport device according to the first or second aspect, the holding unit holds the transport container while moving in a direction changing in stages relative to the transport container.

With this configuration, the holding unit for holding the transport container moves closely toward and away from the transport container in a direction changing in stages relative to the transport container.

According to an invention described in a fourth aspect, in the transport device according to any one of the first to third aspects, the container detecting unit includes a first container detecting unit that detects one side of the transport container and a second container detecting unit that detects another side of the transport container.

With this configuration, the two detecting units (first and second container detecting units) detect the transport container in two directions.

According to the transport device of the present invention, the holding unit for holding the transport container holds the transport container based on the detection of the container detecting unit that detects the transport container, thereby holding the transport container according to the shape or size of the transport container. Thus, transport containers varying in shape or size can be transported without changing the configuration of the transport device (holding unit).

According to the transport device of the present invention, the holding unit for holding the transport container has the function of a popping preventing member that prevents works stored in the transport container from popping out of the transport container. Thus, the transport device does not need to have an additional popping preventing member. This can prevent works in the transport container from popping out of the transport container with a simple device configuration.

BRIEF DESCRIPTION OF THE DRAWINGS

FIGS. 4(a) to 4(c) are plan schematic diagrams showing that a first chuck side member and a second chuck side member of the overhead carriage are moved in two steps;

FIGS. 4(d) and 4(e) are plan schematic diagrams showing that the first chuck side member and the second chuck side member of the overhead carriage are moved in one step;

DETAILED DESCRIPTION OF THE PREFERRED EMBODIMENTS

An overhead carriage 10 will be described below as an example of a transport device according to the present invention.

Figure 1:
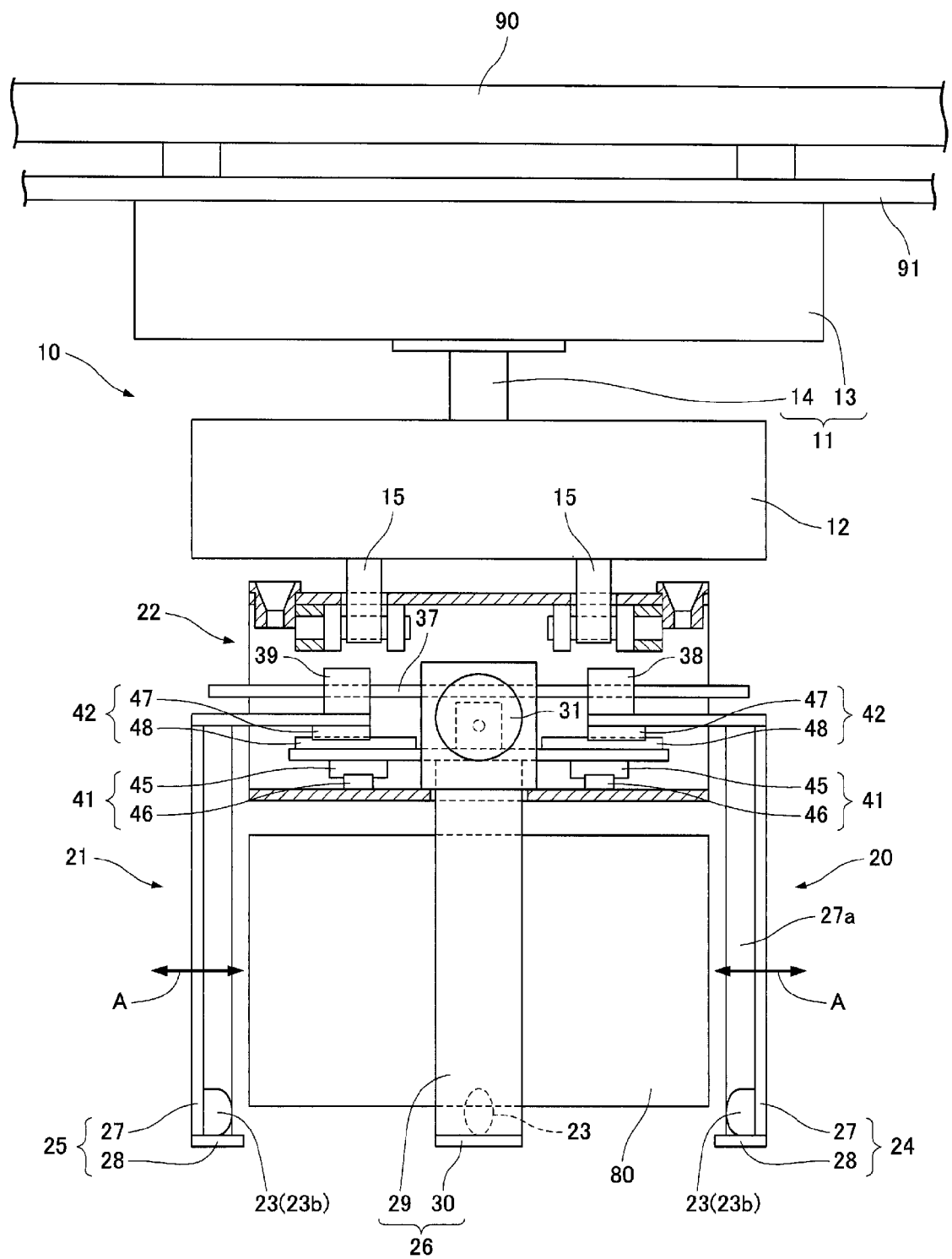
FIG. 1 is a front view showing an overhead carriage as an example of a transport device according to the present invention.

As shown in FIG. 1, the overhead carriage 10 transports works (not shown) such as a semiconductor substrate to a plurality of processing units (not shown) for performing predetermined processing on the works. The overhead carriage 10 holds and transports a magazine 80 (an example of "transport container") that contains the works.

Figure 2:
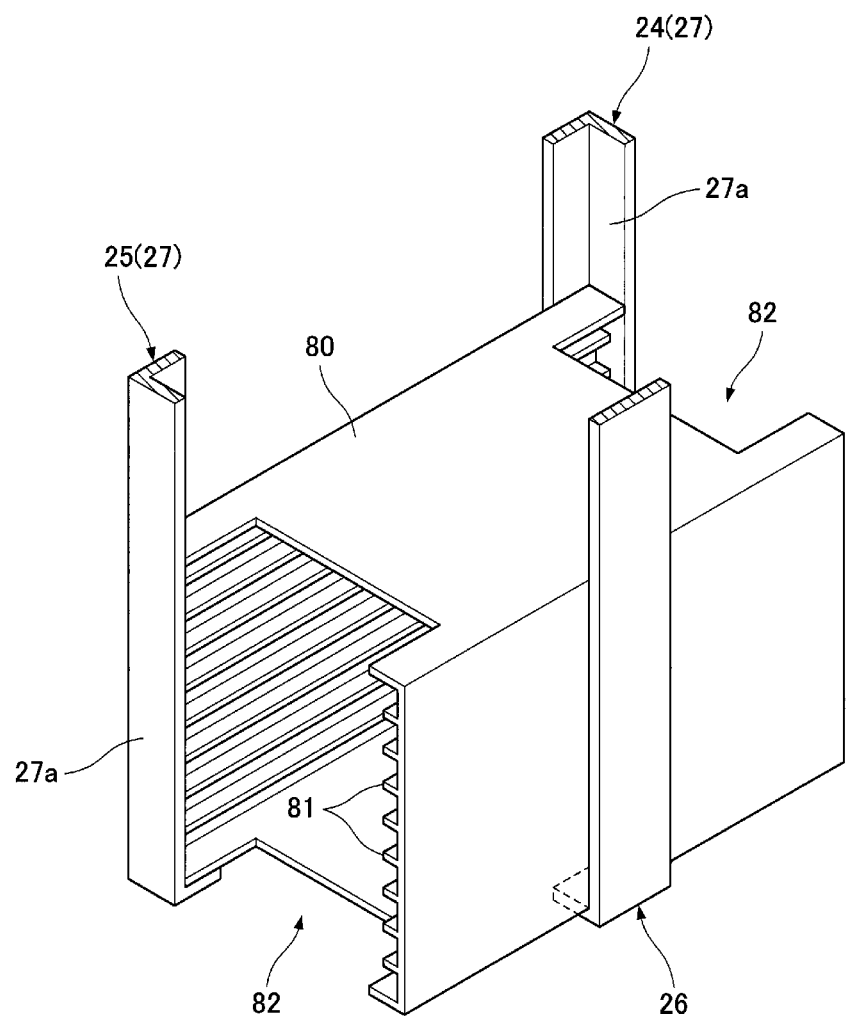
FIG. 2 is a perspective view showing a magazine transported by the overhead carriage.

As shown in FIG. 2, the magazine 80 transported by the overhead carriage 10 is a box transport container substantially shaped like a rectangular parallelepiped. The magazine 80 to be transported contains loading parts 81 accommodating a plurality of works in multiple stages. The magazine 80 is configured to store works from storage ports 82 longitudinally opened on two longitudinal ends of the magazine 80. The top and bottom of the storage port 82 are notched.

[Overhead Carriage 10]

As shown in FIG. 1, the overhead carriage 10 is attached so as to be suspended from a traveling rail 91 provided near a facility ceiling 90. The overhead carriage 10 is movable along the traveling rail 91. The overhead carriage 10 is mainly composed of a mobile unit 11, an elevating unit 12, and a chucking device 20 (an example of "container holding device").

The mobile unit 11 is configured to travel along the traveling rail 91 firmly attached to the ceiling 90. The mobile unit 11 is mainly composed of a linear motor traveling body 13 that generates a traveling thrust for traveling along the traveling rail 91 and a support part 14 that is connected to the traveling body 13 so as to support the elevating unit 12. The traveling body 13 is not limited to a linear motor traveling body as long as the traveling body can travel in a space requiring cleanliness as in a clean room.

The elevating unit 12 elevates with the suspended chucking device 20. The elevating unit 12 is attached to the lower end of the mobile unit 11. The elevating unit 12 has a plurality of elevator belts 15. The elevating unit 12 is configured to simultaneously wind up and down the elevator belts 15. The elevator belts 15 are wound up and down such that the chucking device 20 is vertically moved substantially in a horizontal position while being suspended and supported by the elevator belts 15.

[Chucking Device 20]

The chucking device 20 holds the magazine 80. The chucking device 20 is attached to the elevating unit 12. The chucking device 20 holds the magazine 80 so as to wrap around (pick up) the magazine 80 from the bottom of the magazine 80. The chucking device 20 is mainly composed of a holding unit 21 for holding the magazine 80, a driving unit 22 for driving the holding unit 21, and sensors 23 (an example of "container detecting unit") for detecting the magazine 80.

[Holding Unit 21]

Figure 3:
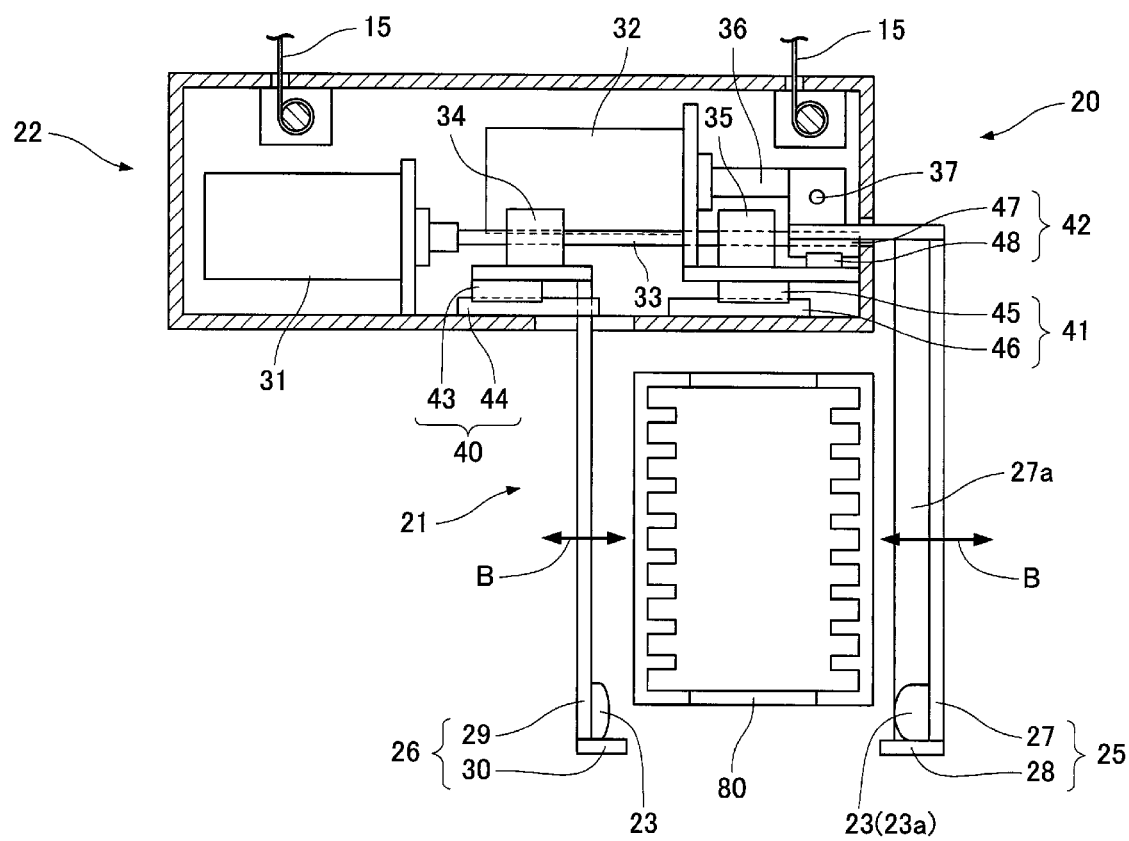
FIG. 3 is a side cross-sectional view showing a chucking device for the overhead carriage.

As shown in FIGS. 1 to 3, the holding unit 21 is extended in the vertical direction of the chucking device 20. The holding unit 21 portably holds the magazine 80 from the bottom of the magazine 80 so as to wrap around (pick up) the magazine 80. In other words, the holding unit 21 is a part for holding the magazine 80. The holding unit 21 includes a plurality of (three in FIG. 1) chuck side members (chuck side members 24, 25, and 26) that are vertically extended. The holding unit 21 holds the magazine 80 with the chuck side members. The holding unit 21 includes the three chuck side members (chuck side members 24, 25, and 26) that securely hold the weight of the magazine 80 on the receiving portions (receiving portions 28 and 30) of the chuck side members (chuck side members 24, 25, and 26). Thus, the magazine 80 can be held with higher stability.

The first chuck side member 24 and the second chuck side member 25 are square guide members that are disposed on the corners of the magazine 80 when holding the magazine 80. The first chuck side member 24 and the second chuck side member 25 hold and guide the corners of the magazine 80. The first chuck side member 24 and the second chuck side member 25 each include an arm portion 27 that comes into contact with the corner of the magazine 80 and the receiving portion 28 that is formed on one end of the arm portion 27 so as to receive the bottom of the magazine 80.

The arm portion 27 is formed by joining two plate members 27a substantially in an L shape according to the shape of the corner of the magazine 80. The arm portions 27 come into contact with the corners of the magazine 80 when the holding unit 21 holds the magazine 80. When the arm portions 27 come into contact with the corners of the magazine 80, the first chuck side member 24 and the second chuck side member 25 can hold the sides of the magazine 80 along with the third chuck side member 26.

Furthermore, the arm portion 27 in contact with the corner of the magazine 80 vertically covers one end of the storage port 82 of the magazine 80 (the storage port 82 of the magazine 80 is partially closed). In other words, the arm portion 27 prevents works stored in the magazine 80 from popping out of the storage port 82. Specifically, as shown in FIG. 2, one of the plate members 27a forming the arm portion 27 has a flat portion that covers one end of the opening of the storage port 82 on the magazine 80 (the flat portion of the plate member 27a comes into contact with one end of the opening of the storage port 82). This reduces the size of the opening of the storage port 82 on the magazine 80, allowing the flat portion of the plate member 27a to lock works that are likely to pop out of the storage port 82.

As has been discussed, the arm portions 27 of the first chuck side member 24 and the second chuck side member 25 have the function of holding the sides (corners) of the magazine 80 and have the function of preventing works stored in the magazine 80 from popping out of the storage port 82.

As shown in FIGS. 1 and 3, the receiving portion 28 is formed by joining a plate member, on which the bottom of the magazine 80 can be disposed, substantially perpendicularly to one end face of the plate member 27a of the arm portion 27. When the holding unit 21 holds the magazine 80, the receiving portion 28 comes into contact with the bottom of the corner of the magazine 80 so as to receive the magazine 80.

The third chuck side member 26 is a face guide member that is disposed at the center of one of the side plates in the longitudinal direction of the magazine 80 when the third chuck side member 26 holds the magazine 80. In other words, the third chuck side member 26 holds the side plate of the magazine 80 and guides the side plate of the magazine 80. Specifically, the third chuck side member 26 is disposed at the center of the side plate opposed to the side plate having the first chuck side member 24 and the second chuck side member 25 on the corners of the magazine 80, the corners being located on two ends of the side plate. The third chuck side member 26 includes an arm portion 29 that comes into contact with the side of the side plate of the magazine 80 and the receiving portion 30 that is formed on one end of the arm portion 29 so as to receive the bottom of the magazine 80.

The arm portion 29 is composed of a plate member that can come into contact with the side of the side plate of the magazine 80. When the holding unit 21 holds the magazine 80, the arm portion 29 comes into contact with the center of the side of one of the side plates of the magazine 80 in the longitudinal direction of the magazine 80. Thus, the third chuck side member 26 can hold the side of the magazine 80 along with the first chuck side member 24 and the second chuck side member 25.

The receiving portion 30 is formed by joining a plate member, on which the bottom of the magazine 80 can be disposed, substantially perpendicularly to one end face of the plate member of the arm portion 29. When the holding unit 21 holds the magazine 80, the receiving portion 30 comes into contact with the bottom of the center of one of the side plates in the longitudinal direction of the magazine 80, receiving the magazine 80.

[Driving Unit 22]

As shown in FIGS. 1 and 3, the driving unit 22 moves the chuck side members 24, 25, and 26 of the holding unit 21. The driving unit 22 is provided on the top of the holding unit 21. The driving unit 22 is mainly composed of motors 31 and 32 and slide members 40, 41, and 42.

The first motor 31 is a motor for moving the chuck side members 24, 25, and 26 perpendicularly (along arrows B in FIG. 3) to the longitudinal direction of the magazine 80. The first motor 31 is connected to a first shaft 33. The first motor 31 is operated so as to rotate the first shaft 33.

The first shaft 33 is composed of a ball screw. The first shaft 33 is reversely threaded at portions where a first nut member 34 and a second nut member 35 are inserted onto the first shaft 33. In other words, the first shaft 33 is formed such that the first nut member 34 and the second nut member 35 move closely toward and away from each other on the first shaft 33 when the first shaft 33 is rotated.

The second motor 32 is a motor for moving the first chuck side member 24 and the second chuck side member 25 in the longitudinal direction of the magazine 80 (along arrows A in FIG. 1). The second motor 32 is connected to a second shaft 36. The second motor 32 is operated so as to rotate the second shaft 36.

The second shaft 36 is connected to a third shaft 37. The second shaft 36 is rotated so as to rotate the third shaft 37.

The third shaft 37 is composed of a ball screw. The third shaft 37 is reversely threaded at portions where a third nut member 38 and a fourth nut member 39 are inserted onto the third shaft 37. In other words, the third shaft 37 is formed such that the third nut member 38 and the fourth nut member 39 move closely toward and away from each other on the third shaft 37 when the third shaft 37 is rotated.

The first slide member 40 is a member for moving the third chuck side member 26 perpendicularly (along the arrows B in FIG. 3) to the longitudinal direction of the magazine 80. The first slide member 40 includes a first guide 43 that supports the third chuck side member 26 and a first guide rail 44 that slides the first guide 43.

The second slide member 41 is a member for moving the first chuck side member 24 or the second chuck side member 25 perpendicularly (along the arrows B in FIG. 3) to the longitudinal direction of the magazine 80. The second slide member 41 includes a second guide 45 that supports the first chuck side member 24 or the second chuck side member 25 and a second guide rail 46 that slides the second guide 45.

The third slide member 42 is a member for moving the first chuck side member 24 or the second chuck side member 25 in the longitudinal direction (along the arrows A in FIG. 1) of the magazine 80. The third slide member 42 includes a third guide 47 that supports the first chuck side member 24 or the second chuck side member 25 and a third guide rail 48 that slides the third guide 47.

In the overhead carriage 10, the third slide member 42 is disposed on the top of the second slide member 41, in other words, the two slide members are vertically disposed in the driving unit 22. This configuration allows the first chuck side member 24 and the second chuck side member 25 to move in two directions (the arrows A in FIG. 1 and the arrows B in FIG. 3).

[Sensor 23]

As shown in FIGS. 1 and 3, the sensors 23 are provided on the lower ends of the chuck side members 24, 25, and 26 (near the receiving portions 28). The sensors 23 detect the magazine 80 held by the holding unit 21. The detection result of the sensor 23 is transmitted as a detection signal to a control unit (not shown). The control unit controls the holding operations of the chuck side members 24, 25, and 26 on the magazine 80 in response to detection signals from the sensors 23.

The sensor 23 is composed of a capacitance proximity sensor. The sensor 23 is not limited to a capacitance sensor. Since the sensor type may be selected depending on the material, color, and so on of the magazine 80, the sensor 23 may be, for example, an optical or direct-contact sensor. The sensors 23 provided on the lower ends of the chuck side members 24, 25, and 26 are not limited to this configuration. The sensors 23 may be provided at the centers or the upper ends of the chuck side members 24, 25, and 26 as long as the magazine 80 can be detected.

Moreover, each of the sensors 23 provided on the lower ends of the first chuck side member 24 and the second chuck side member 25 includes a first sensor 23a (an example of "first container detecting unit") that detects one of the wall boards of the magazine 80 (a wall board formed in the longitudinal direction of the magazine 80) and a second sensor 23b (an example of "second container detecting unit") that detects the wall board formed perpendicularly to the wall board detected by the first sensor 23a (the wall board formed perpendicularly to the longitudinal direction of the magazine 80). In other words, the first chuck side member 24 and the second chuck side member 25 includes the two sensors that detect different positions (directions of detection) of the magazine 80 so as to detect the magazine 80 in two different directions.

When the first chuck side member 24 and the second chuck side member 25 are moved perpendicularly (along the arrows B in FIG. 3) to the longitudinal direction of the magazine 80, the first sensor 23a detects the wall board formed in the longitudinal direction of the magazine 80.

When the first chuck side member 24 and the second chuck side member 25 are moved in the longitudinal direction of the magazine 80 (along the arrows A in FIG. 1), the second sensor 23b detects the wall board formed perpendicularly to the longitudinal direction of the magazine 80.

Each of the sensors 23 provided on the lower ends of the first chuck side member 24 and the second chuck side member 25 includes the two sensors (the first sensor 23a and the second sensor 23b). The sensor 23 is not limited to this configuration. The sensor 23 may be composed of a single sensor as long as the magazine 80 can be detected according to the movements of the first chuck side member 24 and the second chuck side member 25.

[The Holding Operations of the Chuck Side Members 24, 25, and 26]

The holding operations of the chuck side members 24, 25, and 26 will be described below.

As shown in FIG. 4(a), in the overhead carriage 10, the chuck side members 24, 25, and 26 first move perpendicularly to the longitudinal direction of the magazine 80 (along arrows C and the width of the magazine 80). Subsequently, the chuck side members 24, 25, and 26 hold the longitudinal side plates of the magazine 80. After that, as shown in FIG. 4(b), the first chuck side member 24 and the second chuck side member 25 move in the longitudinal direction of the magazine 80 (along arrows D). The first chuck side member 24 and the second chuck side member 25 then hold the side plates provided along the width of the magazine 80. In other words, in the overhead carriage 10, the first chuck side member 24 and the second chuck side member 25 hold the corners of the magazine 80 while changing the moving directions in two ways with respect to the magazine 80. This is because if the first chuck side member 24 and the second chuck side member 25 are moved in one step according to a movement of the third chuck side member 26 as shown in FIG. 4(d), the first chuck side member 24 and the second chuck side member 25 may be caught by the magazine 80 depending on the shape or size of the magazine 80, thereby preventing holding of the magazine 80 (see FIG. 4(e)). Since the first chuck side member 24 and the second chuck side member 25 are moved in two steps, even the magazines 80 varying in shape or size can be held by the holding unit 21 without the chuck side members 24, 25, and 26 being caught by the magazines 80. These operations will be specifically described below.

As shown in FIG. 3, when the first motor 31 is started, the first shaft 33 is rotated so as to move the first nut member 34 toward the center of the first shaft 33. The movement of the first nut member 34 allows the first guide 43 of the first slide member 40 fixed to the first nut member 34 to slide along the first guide rail 44. Thus, the third chuck side member 26 supported by the first guide 43 moves closely toward the magazine 80 (so as to hold the side plates of the magazine 80) perpendicularly to the longitudinal direction of the magazine 80 (along the arrows B and the width of the magazine 80 in FIG. 3).

At the same time, the first motor 31 is started to rotate the first shaft 33. At this point, the second nut member 35 moves to the center of the first shaft 33. The movement of the second nut member 35 allows the second guide 45 of the second slide member 41 fixed to the second nut member 35 to slide along the second guide rail 46. Thus, the first chuck side member 24 and the second chuck side member 25 that are supported by the second guide 45 move closely toward the magazine 80 along the width of the magazine 80 (along the arrows B in FIG. 3). The second motor 32 also moves along the width of the magazine 80 (along the arrows B in FIG. 3) in response to the sliding of the second guide 45.

When the first motor 31 is started to move the chuck side members 24, 25, and 26 toward the magazine 80, the sensor 23 (first sensor 23a) provided on each of the chuck side members 24, 25, and 26 detects the presence or absence of the magazine 80. Specifically, a distance between each of the chuck side members 24, 25, and 26 and the magazine 80 is detected from the detection result of the sensor 23. The sensor 23 transmits the detection result as the detection signal to the control unit (not shown). The control unit determines a distance (positional relationship) between each of the chuck side members 24, 25, and 26 and the magazine 80 based on the detection signal from the sensor 23. Moreover, the control unit controls the activation of the first motor 31 so as to control the movements of the chuck side members 24, 25, and 26. When the sensor 23 detects the magazine 80 at a predetermined position, specifically, a contact position between the chuck side members 24, 25, and 26 and the wall boards of the magazine 80, the control unit stops driving the first motor 31 to stop the movements of the chuck side members 24, 25, and 26.

Subsequently, as shown in FIGS. 1 and 3, the second motor 32 is started to rotate the second shaft 36 and then the third shaft 37. The rotation of the third shaft 37 moves the third nut member 38 and the fourth nut member 39 toward the center of the third shaft 37 so as to come close to each other. Subsequently, the third guides 47 of the third slide members 42, to which the third nut member 38 and the fourth nut member 39 are fixed, slide along the third guide rails 48. This allows the first chuck side member 24 and the second chuck side member 25 to move in the longitudinal direction of the magazine 80 (along the arrows B in FIG. 1) so as to come close to each other, holding the corners of the magazine 80.

When the second motor 32 is started to move the first chuck side member 24 and the second chuck side member 25 toward the magazine 80, the sensor 23 (second sensor 23b) provided on each of the first chuck side member 24 and the second chuck side member 25 detects the magazine 80 and transmits the detection result as the detection signal to the control unit (not shown). The control unit determines a distance (positional relationship) between the first and second chuck side members 24 and 25 and the magazine 80 based on the detection signal from the sensor 23 (second sensor 23b). Moreover, the control unit controls the activation of the second motor 32 so as to control the movements of the first and second chuck side members 24 and 25. When the sensor 23 (second sensor 23b) detects the magazine 80 at a predetermined position, specifically, a contact position between the first and second chuck side members 24 and 25 and the wall boards of the magazine 80, the control unit stops driving the second motor 32 to stop the movements of the first and second chuck side members 24 and 25.

As has been discussed, in the overhead carriage 10, the sensor 23 provided on each of the chuck side members 24, 25, and 26 detects a distance between each of the chuck side members 24, 25, and 26 and the magazine 80; meanwhile, the movements of the chuck side members 24, 25, and 26 are controlled. This can freely change positions where the chuck side members 24, 25, and 26 hold the magazine 80, according to the shape or size of the magazine 80. Thus, even if the magazines 80 having different shapes and sizes are transported when necessary, the chuck side members 24, 25, and 26 can be moved according to the shapes or sizes of the magazines 80. This does not need to change the structure of the overhead carriage 10 (e.g., the structures of the chuck side members 24, 25, and 26) according to the shape or size of the magazine 80. The magazines 80 varying in shape or size can be transported only by changing the positions where the chuck side members 24, 25, and 26 hold the magazine 80 in the same device structure.

In the overhead carriage 10, the first chuck side member 24 and the second chuck side member 25 that hold the magazine 80 can prevent works from popping out. Such a simple structure can prevent works stored in the magazine 80 from popping out.

Furthermore, in the overhead carriage 10, the magazine 80 is detected by the two sensors (the first sensor 23a and the second sensor 23b) that detect the magazine 80 at different positions; meanwhile, the moving directions of the first chuck side member 24 and the second chuck side member 25 relative to the magazine 80 are changed in stages, allowing the first chuck side member 24 and the second chuck side member 25 to hold the magazine 80 without being caught by the magazine 80.

In the present embodiment, the magazine 80 is not limited to the configuration of FIG. 2 as long as the magazine 80 is typically shaped and sized so as to store works such as a semiconductor substrate. For example, a magazine 80A shaped as shown in FIG. 5(a) may be used.

Figure 5A:
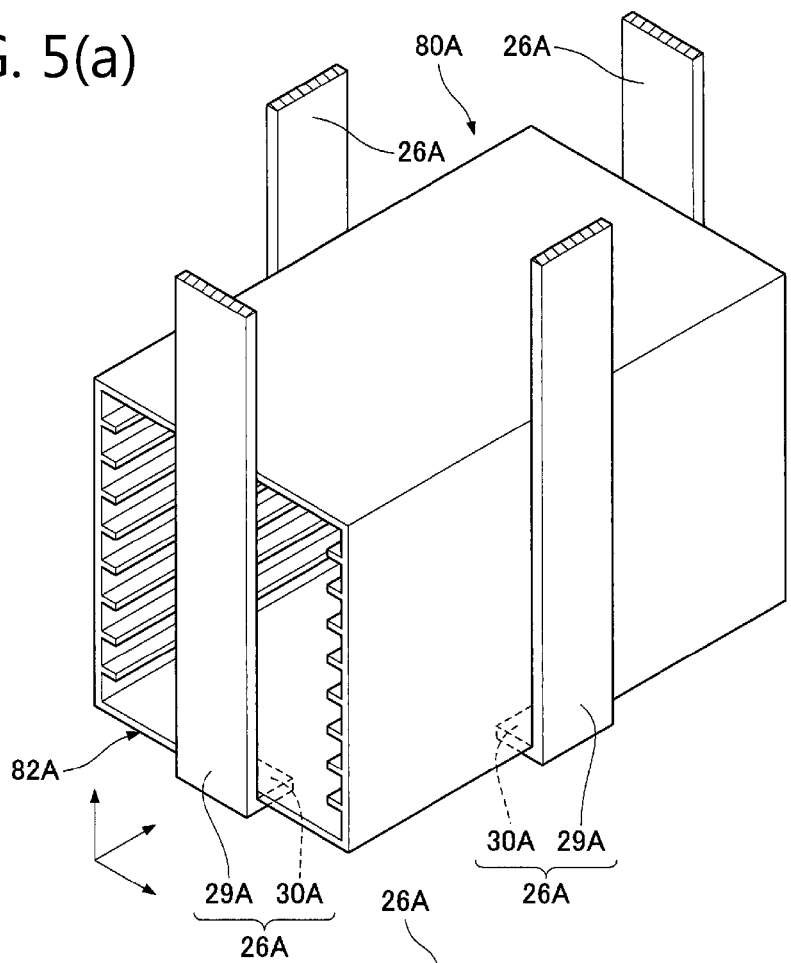
FIG. 5(a) is a perspective view showing another embodiment of the magazine transported by the overhead carriage.

If the magazine 80A in FIG. 5(a) is transported by the overhead carriage 10, that is, in the transportation of the magazine 80A including an unnotched storage port 82A, the centers of the side plates of the magazine 80A may be held by four surface-guide side members 26A. Like the third chuck side member 26, the surface-guide side member 26A includes an arm portion 29A that is composed of a plate member capable of coming into contact with the side plate of the magazine 80A and a receiving portion 30A that is formed by joining a plate member substantially perpendicularly to one end face of the plate member of the arm portion 29A so as to place the bottom of the magazine 80A on the plate member.

Figure 5B:
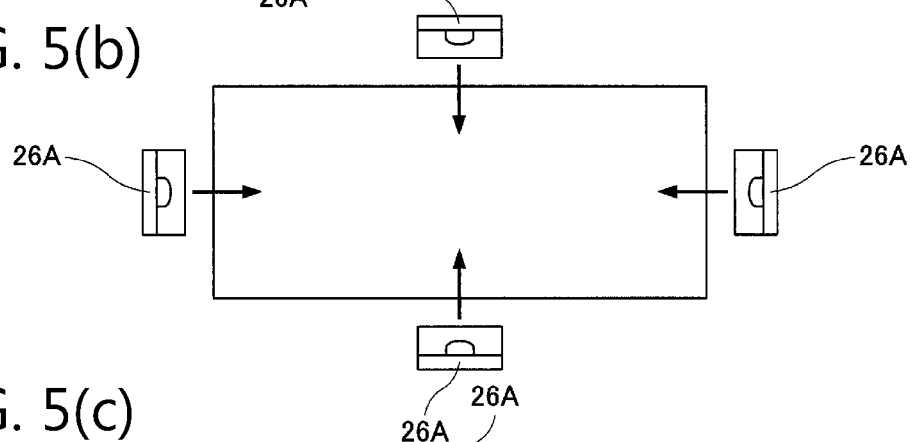
FIGS. 5(b) and 5(c) are plan schematic diagrams showing that a surface guide member is moved relative to the magazine.
Figure 5C:
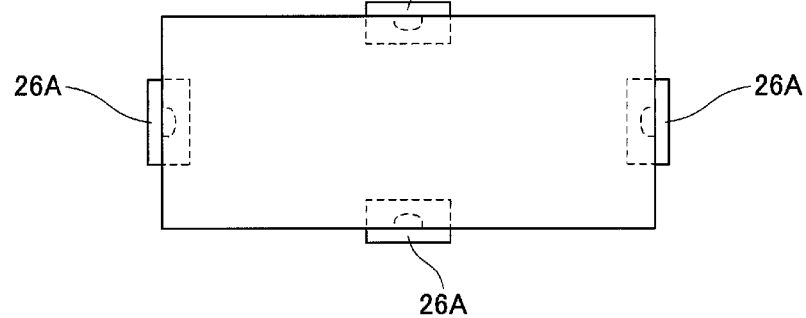

In this case, as shown in FIGS. 5(b) and 5(c), the four surface-guide side members 26A are simultaneously (in one step) moved closely toward the magazine 80A so as to hold the centers of the side plates of the magazine 80A.

In this case, as shown in FIG. 5(a), the arm portion 29A vertically covers the center of the storage port 82A of the magazine 80A (the center of the storage port 82A of the magazine 80A is closed). In other words, the arm portion 29A prevents works stored in the magazine 80A from popping out of the storage port 82A. Specifically, as shown in FIG. 5(a), the flat portion of the arm portion 29A covers the center of the opening of the storage port 82A on the magazine 80A (the flat portion of the arm portion 29A comes into contact with the center of the opening of the storage port 82A). This narrows the opening of the storage port 82A on the magazine 80A such that works popping out of the storage port 82A can be locked by the flat portion of the arm portion 29A.

In the magazine 80A, the four surface-guide side members 26A hold the centers of the side plates of the magazine 80A. The magazine 80A is not limited to this configuration.

The corners of the magazine 80A may be held by the first chuck side member 24 and the second chuck side member 25 while the center of the side plate of the magazine 80A may be held by the third chuck side member 26.

In the present embodiment, the transport device is the overhead carriage 10 that travels on a ceiling. The transport device is not limited to the overhead carriage 10. For example, the transport device may include the chucking device 20 on a vehicle body that travels on a floor. In this case, the chucking device 20 is attached to an arm member vertically pivotally mounted on a rotary table rotatably provided on the vehicle body.

In the present embodiment, the chuck side members 24, 25, and 26 of the holding unit 21 are moved by a configuration like the driving unit 22 (including the motors 31 and 32 and the slide members 40, 41, and 42). The driving unit is not limited to this configuration.

Having described the invention, the following is claimed:

1. A transport device for transporting a transport container, the transport container having storage ports, the storage ports being respectively defined by openings that are respectively formed in opposite longitudinal ends of the transport container, the transport container being configured to provide storage for a work, the transport device comprising:
a container holding device comprising a holding unit and a container detecting unit, the holding unit being configured to hold the transport container during a transport thereof, the holding unit comprising a plurality of chuck side members, at least two of the chuck side members being configured to respectively hold the transport container at the storage ports, each of the chuck side members being configured to hold the transport container from a bottom thereof so as to wrap around the transport container, the container detecting unit being configured to detect a distance between the chuck side members and the transport container, each of the at least two of the chuck side members comprising an arm portion that is moveable across the distance to contact the transport container and at least partially cover a corresponding one of the storage ports.

2. The transport device according to claim 1, wherein, when the arm portion is in contact with the transport container, the arm portion prevents the stored work from popping out of the storage port.

3. The transport device according to claim 1 or 2, wherein the chuck side members are moveable in directions changing in stages while holding the transport container.

4. The transport device according to claim 1 or 2, wherein the container detecting unit includes a first container detecting unit that detects one side of the transport container and a second container detecting unit that detects another side of the transport container.

5. The transport device according to claim 3, wherein the container detecting unit includes a first container detecting unit that detects one side of the transport container and a second container detecting unit that detects another side of the transport container.

* * * * *